US007259576B2

(12) United States Patent
Parker et al.

(10) Patent No.: US 7,259,576 B2
(45) Date of Patent: Aug. 21, 2007

(54) METHOD AND APPARATUS FOR A TWISTING FIXTURE PROBE FOR PROBING TEST ACCESS POINT STRUCTURES

(75) Inventors: Kenneth P Parker, Ft Collins, CO (US); Chris R Jacobsen, Fort Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/079,702

(22) Filed: Mar. 14, 2005

(65) Prior Publication Data

US 2006/0202675 A1 Sep. 14, 2006

(51) Int. Cl.
*G01R 31/08* (2006.01)

(52) U.S. Cl. ...................................... 324/754
(58) Field of Classification Search ............ None
See application file for complete search history.

(56) References Cited

U.S. PATENT DOCUMENTS

| | | | | | |
|---|---|---|---|---|---|
| 4,307,928 | A | * | 12/1981 | Petlock, Jr. ................. | 439/824 |
| 4,397,519 | A | * | 8/1983 | Cooney ...................... | 439/824 |
| 4,885,533 | A | * | 12/1989 | Coe ........................... | 324/754 |
| 5,032,787 | A | * | 7/1991 | Johnston et al. ............ | 324/761 |
| 5,157,325 | A | * | 10/1992 | Murphy ...................... | 324/761 |
| 5,357,192 | A | * | 10/1994 | Van Zee et al. ............ | 324/758 |
| 5,804,984 | A | * | 9/1998 | Alcoe et al. ................ | 324/761 |
| 5,850,147 | A | * | 12/1998 | Stowers et al. ............. | 324/761 |
| 6,051,982 | A | * | 4/2000 | Alcoe et al. ................ | 324/754 |
| 6,552,430 | B1 | * | 4/2003 | Perez et al. ................. | 257/738 |
| 6,605,954 | B1 | * | 8/2003 | Nagar ........................ | 324/755 |
| 7,102,369 | B2 | * | 9/2006 | Jung ........................... | 324/754 |
| 2005/0030050 | A1 | * | 2/2005 | Jung ........................... | 324/754 |

* cited by examiner

*Primary Examiner*—Ha Tran Nguyen
*Assistant Examiner*—Richard Isla-Rodas

(57) ABSTRACT

A twisting fixture probe for cleaning oxides, residues or other contaminants from the surface of a solder bead probe and probing a solder bead probe on a printed circuit board during in-circuit testing.

14 Claims, 11 Drawing Sheets

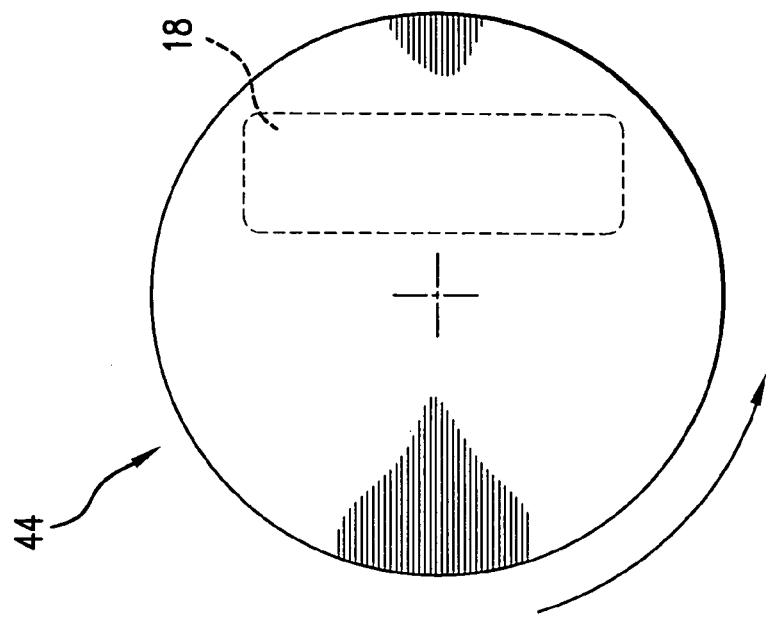
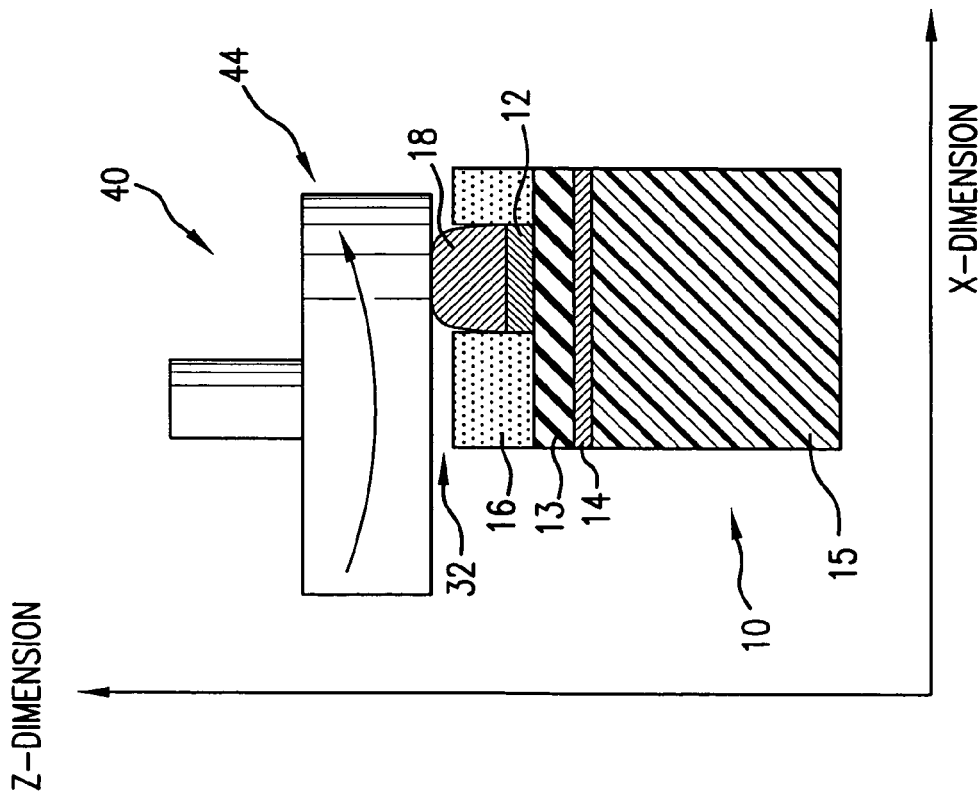
FIG. 4B
FIG. 4A

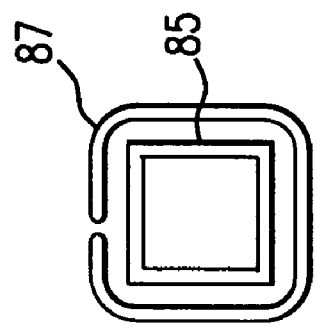
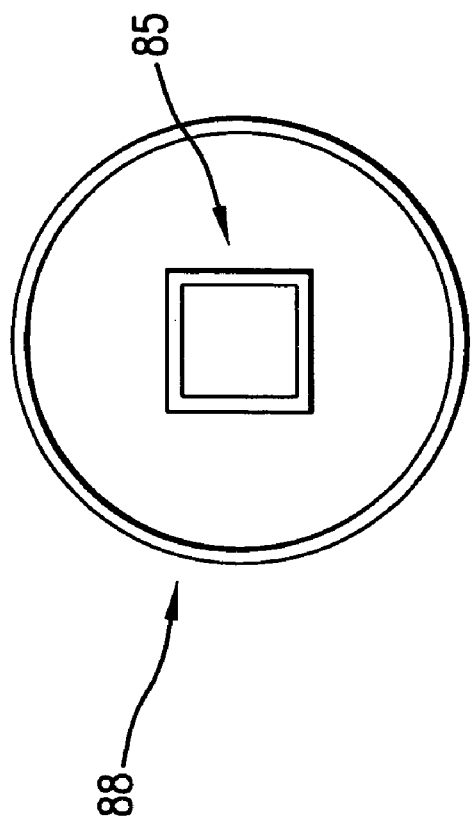

METHOD AND APPARATUS FOR A TWISTING FIXTURE PROBE FOR PROBING TEST ACCESS POINT STRUCTURES

REFERENCE TO RELATED PATENT DOCUMENTS

The subject matter of this patent application is related to that of U.S. patent application Ser. No. 10/670,649 entitled Printed Circuit Board Test Access Point Structures And Methods For Making The Same filed Sep. 24, 2003 by Kenneth P. Parker, Ronald J. Peiffer and Glen E. Leinbach; U.S. patent application Ser. No. 10/972,829 entitled Method And Apparatus For Manufacturing And Probing Printed Circuit Board Test Access Point Structures filed Oct. 25, 2004 by Kenneth P. Parker and Chris R. Jacobsen; and U.S. patent application Ser. No. 10/978,147 entitled Method and Apparatus for a Twisting Fixture Probe for Probing Test Access Point Structures filed Oct. 29, 2004 by Kenneth P. Parker and Chris R. Jacobsen, all of which are assigned to Agilent Technologies, Inc. and are hereby incorporated herein by reference.

BACKGROUND OF THE INVENTION

Printed circuit assemblies (PCA's) are typically tested after manufacture to verify the continuity of traces between pads and vias on the board and to verify that components loaded on the PCA perform within specifications. Such printed circuit assembly testing is generally performed with automated in-circuit testers or ICT's and requires complex tester resources. The tester hardware must generally be capable of probing conductive pads, vias and traces on the board under test.

In-circuit testers (ICT) have traditionally used "bed-of-nails" (BON) access to gain electrical connectivity to circuit wiring (traces, nets, pads) for control and observation capability needed for testing. The Agilent 3070 is one typical in-circuit tester and is available from Agilent Technologies, Inc. of Palo Alto, Calif. This necessitates having access targets within the layout of circuit nets that can be targets for ICT probes. Test access points are usually circular targets with 28 to 35 mil diameter that are connected to traces on the printed circuit board. In some cases these targets are deliberately added test pads, and in other cases the targets are "via" pads surrounding vias already provided in the printed circuit.

Lower diameter targets are increasingly difficult to hit reliably and repeatably, especially when a test fixture may contain several thousand such probes. It is always desirable to use larger diameter targets, but this is in fundamental conflict with the industry trend towards higher densities and smaller geometry devices.

Yet another industry trend is to use higher and higher speed logic families. One Megahertz (MHz) designs became ten MHz designs, then 100 MHz designs, and are now reaching the Gigahertz domain. The increases in logic speed necessitate industry attention to board layout rules for higher-speed interconnects. The goal of these rules is to create a controlled impedance pathway that minimizes noise, crosstalk and signal reflections. Printed circuit boards traces that carry high-speed signals tend to have critical layout requirements and require controlled characteristic impedances. When traditional test probe targets are added, this causes discontinuities in the controlled impedances and may damage signal fidelity.

FIG. 1A illustrates a classic pair of differential transmission signal traces 102a, 102b on a portion of a printed circuit board 100. As illustrated, the printed circuit board 100 is formed as a plurality of layers. In the illustrative embodiment, the printed circuit board 100 includes a ground plane 104 layered over a substrate 105, a dielectric 103 layered over the ground plane 104, traces 102a, 102b layered over the dielectric 103, a solder mask 106 layered exposed surfaces of the dielectric 103, and test access targets 115a and 115b. In such a layout, there are a number of critical parameters that affect the impedance of the signal path. These parameters include trace width 110, trace separation 111, trace thickness 112, and dielectric constants of the solder mask and board material. These parameters influence the inductance, capacitance, and resistance (skin effect and DC) of the traces, which combine to determine the transmission impedance. It is generally desirable to control this value across the entire run of each trace 102a, 102b.

In some higher speed designs it is also important to control the symmetry of the traces. However, routing signals on a crowded printed circuit board necessitates curves and bends in the path, which makes matching lengths and symmetries more difficult. In some cases, series components (such as series terminations or DC blocking capacitors) may be included in the path, and these have dimensions that differ from the layout parameters. Signals may also have to traverse connectors, which add to the difficulties.

Another trend is toward higher and higher density boards, which are also layout critical. When traditional test probe targets are added to a high-density board, the board-layout is generally disturbed, in which adding test probe targets to one or more nodes necessitates moving several others out of the way. Such changes to high-density boards in many cases, may not be practical, as there may not be any room to move traces. If any of the signal traces also happen to be high-frequency signal traces, then the bends needed to re-route them may also have a negative performance impact as well as the negative effects of the conventional target itself.

Additional difficulties arise when testing is considered. Testing requires tester access to circuit traces at particular probe targets. Layout rules typically require test targets to be at least 50 mils apart and may require the diameter of the test point targets to greatly exceed the width of the traces. FIGS. 1A and 1B illustrate test targets 115a, 115b symmetrically positioned 50 mils apart on the differential signal traces 102a, 102b. As seen in FIGS. 1A and 1B, large test targets 115a is being probed by a typical fixture probe 116 with a sharp head 120, such as those available from Interconnect Devices, Inc., 5101 Richland Avenue, Kansas City, Kans. 66106. The sharp probes 116 help break through any oxide or residue build up on the test targets 115a and 115b.

The positioning of test targets 102a, 102b can be problematic. In many cases the need to keep a minimum separation between targets (typically 50 mils, minimum) is in direct conflict with controlled impedance layout rules. These conflicts lead to either a compromise in controlled impedance integrity and optimal circuit layout for performance and space, or a forced reduction in target placement with a resulting reduction in testability.

While high-speed printed circuit boards are one example of layout-critical circuits, another more general case is that of high-density boards. Adding conventional probe targets to a high-density board will most likely disturb the layout. For example, adding test points to just one or more nodes may require moving several other traces out of the way. In many cases, in a high-density circuit design, this may be impractical, if not impossible, as there may not be any room to move these traces in a crowded circuit layout. If any traces are also high-frequency signal traces, then the re-routing may have an additional negative performance impact as well as the negative effects to the optimal circuit layout itself.

As discussed more fully in U.S. patent application Ser. No. 10/670,649 entitled Printed Circuit Board Test Access Point Structures And Methods For Making The Same filed Sep. 24, 2003 by Kenneth P. Parker et al. and US Patent Application entitled Method And Apparatus For Manufacturing And Probing Printed Circuit Board Test Access Point Structures filed Oct. 25, 2004 by Kenneth P. Parker and shown in FIGS. 2A-2C, a new paradigm has been developed to replace the old test paradigm where large probe targets are laid out on a printed circuit board and probed with sharp-pointed fixture probes mounted in a test fixture.

As shown in FIGS. 2A-2C small hemi-ellipsoidal solder beads or test access points 18a and 18b are added to traces 12a and 12b on a printed circuit board 10 without perturbing the board's layout or performance by taking advantage of the z-dimension. As illustrated, the printed circuit board 10 is formed as a plurality of layers. In the illustrative embodiment, the printed circuit board 10 includes a ground plane 14 layered over a substrate 15, a dielectric 13 layered over the ground plane 14, traces 12a, 12b layered over the dielectric 13, a solder mask 16 layered exposed surfaces of the traces 12a and 12b and dielectric 13, and test access points 18a and 18b.

As noted above, an important factor in probing is obtaining a good electrical contact between the fixture probe and the test target. In the old paradigm, this was typically handled by probing with a sharp probe tip 120. However, this method may be problematic with bead probes or test access point structures 18a and 18b, as the test access point structures may have very small dimensions in the x-y plane, in the order of 3-5 mils wide by 15-20 mils long or less. Current design for test guidelines for ICT (in circuit testers) require a minimum 30 mil diameter test pad or target by a chisel or spear tipped probe. The small dimensions of the test access point structures in the x-y plane in combination with the small dimensions of the chisel or spear tipped test fixture probe would very likely create test access accuracy and reliability problems. Simply, it may be hard to hit a small target with a sharp tipped probe with current industry test fixture standards. Also, while a chisel or spear tipped test fixture probe may be effective in disturbing surface contaminants on a 30 mil or greater test pad, assuming it could reliably hit a 3-5 mil test access point structure, it would very likely catastrophically damage the test access point structure. There is a need in the industry for a method to ensure good electrical contact between bead probes or test access point structures and fixture probes.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 4A is a cross-sectional side view showing a portion of a printed circuit board with a test access point structure on a trace and a twisting fixture probe contacting the test access point structure;

FIG. 4B is a top view of a test access point structure with a twisting fixture probe imposed there over;

FIG. 11 illustrates the end of the plunger shaft of the twisting probe of FIG. 7;

FIG. 12 illustrates the plunger shaft end inside the squared spring of FIG. 7;

DETAILED DESCRIPTION

On a trace defined in an x-, y-, z-coordinate system where the x-demension represents the trace width, the y-dimension represents the trace length, and the z-dimension represents the trace thickness, it will be recognized by those skilled in the art that present techniques for test access point placement on a printed circuit board utilize only the x- and y-dimensions. The present invention takes a different approach by taking advantage of the z-dimension, that is, the trace thickness. In this regard, the test access point structure of the invention is a localized "high point" on a printed circuit board trace that does not significantly perturb the impedance of the trace and that can be targeted with a probe. Throughout this specification, test access point structure and bead probe structure are used interchangeably.

Figure 1A:
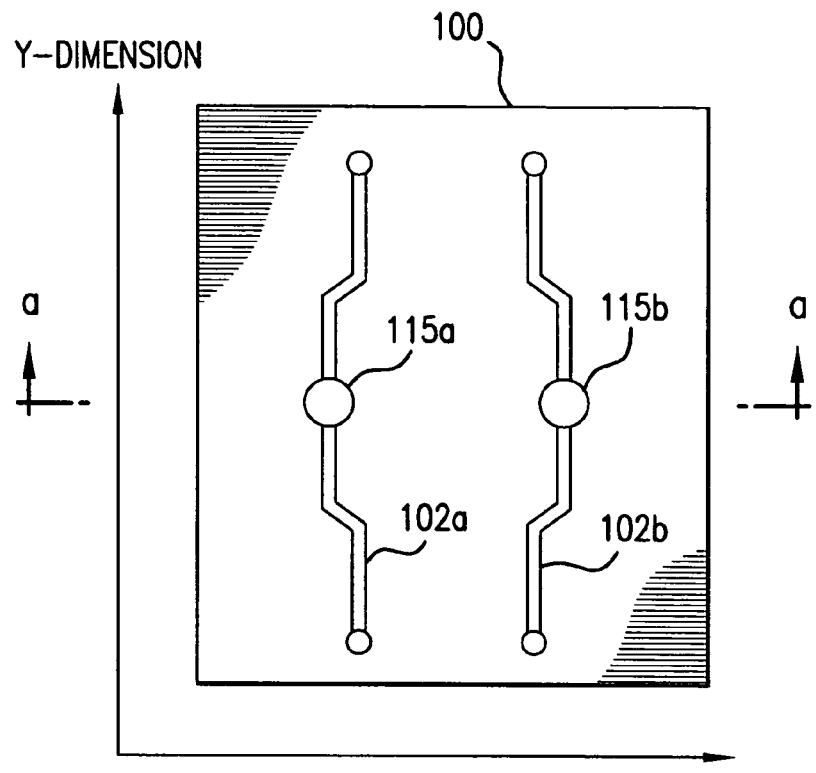
FIG. 1A is a top view of a conventional printed circuit board with traces showing the x- and y-dimensions in the x-, y-, z-coordinate system.
Figure 1B:
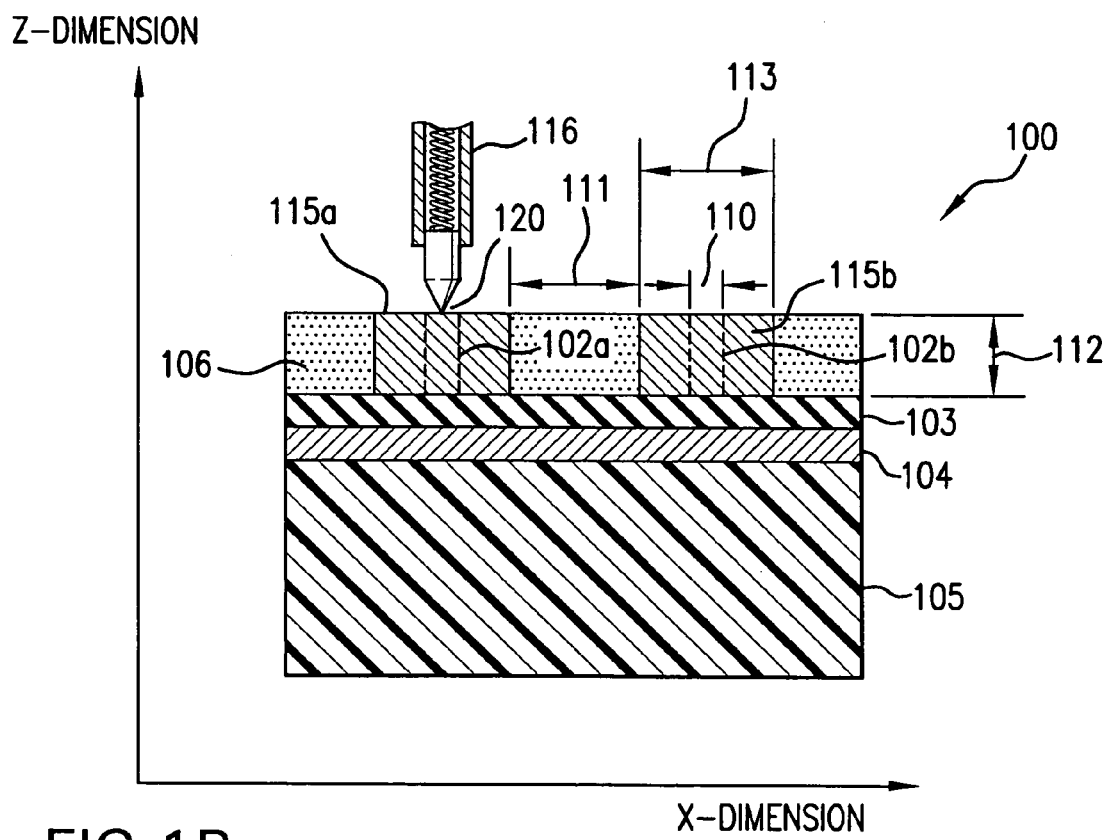
FIG. 1B is a cross-sectional side view of the printed circuit board with differential signal traces showing the x- and z-dimensions in the x-, y-, z-coordinate system.
Figure 2A:
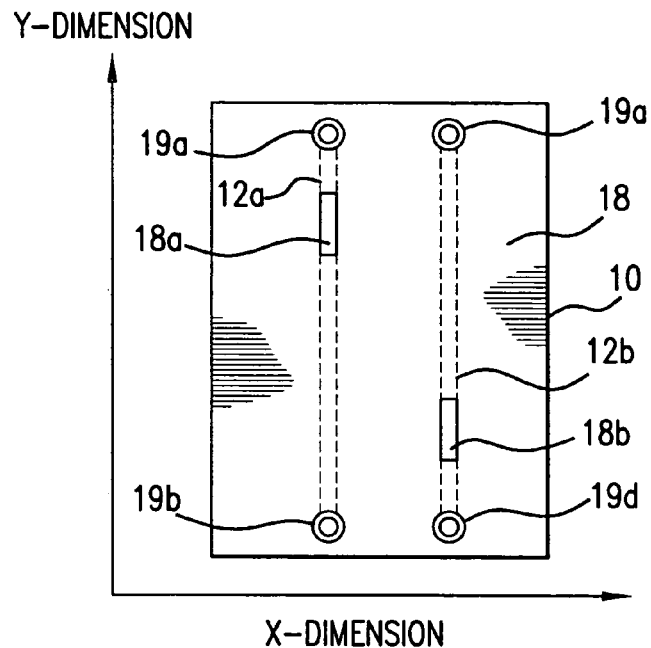
FIG. 2A is a top view of a printed circuit board showing the x- and y-demension of the differential signal traces in the x-, y-, z-coordinate system with a test access point structure.
Figure 2B:
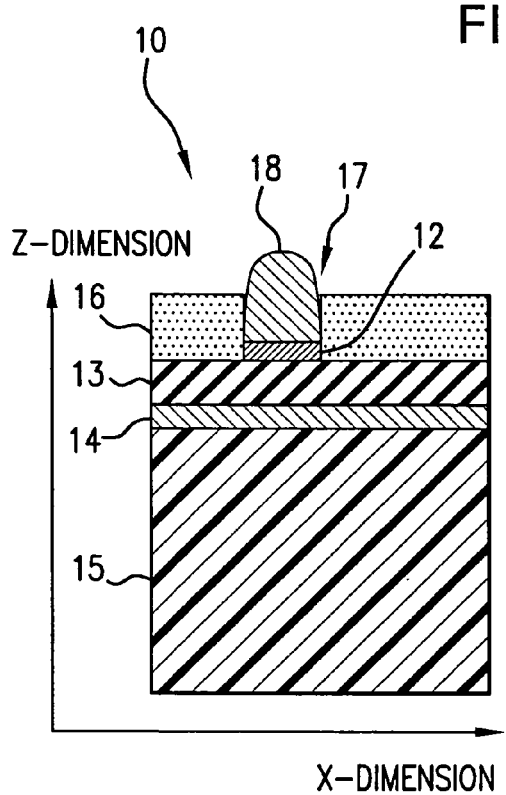
FIG. 2B is a cross-sectional side view of the printed circuit board in FIG. 2A showing the z- and x-dimensions in the x-, y-, z-coordinate system with a test access point structure.
Figure 2C:
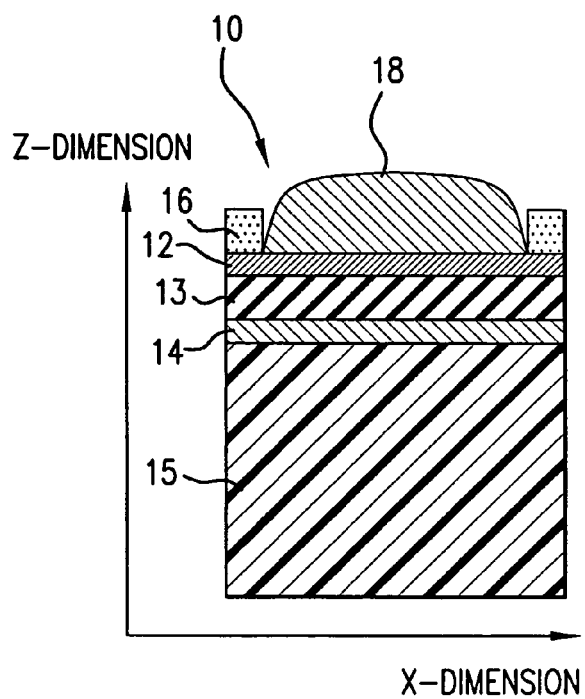
FIG. 2C is a cross-sectional side view of the printed circuit board in FIG. 2A showing the z- and y-dimensions in the x-, y-, z-coordinate system with a test access point structure.
Figure 3:
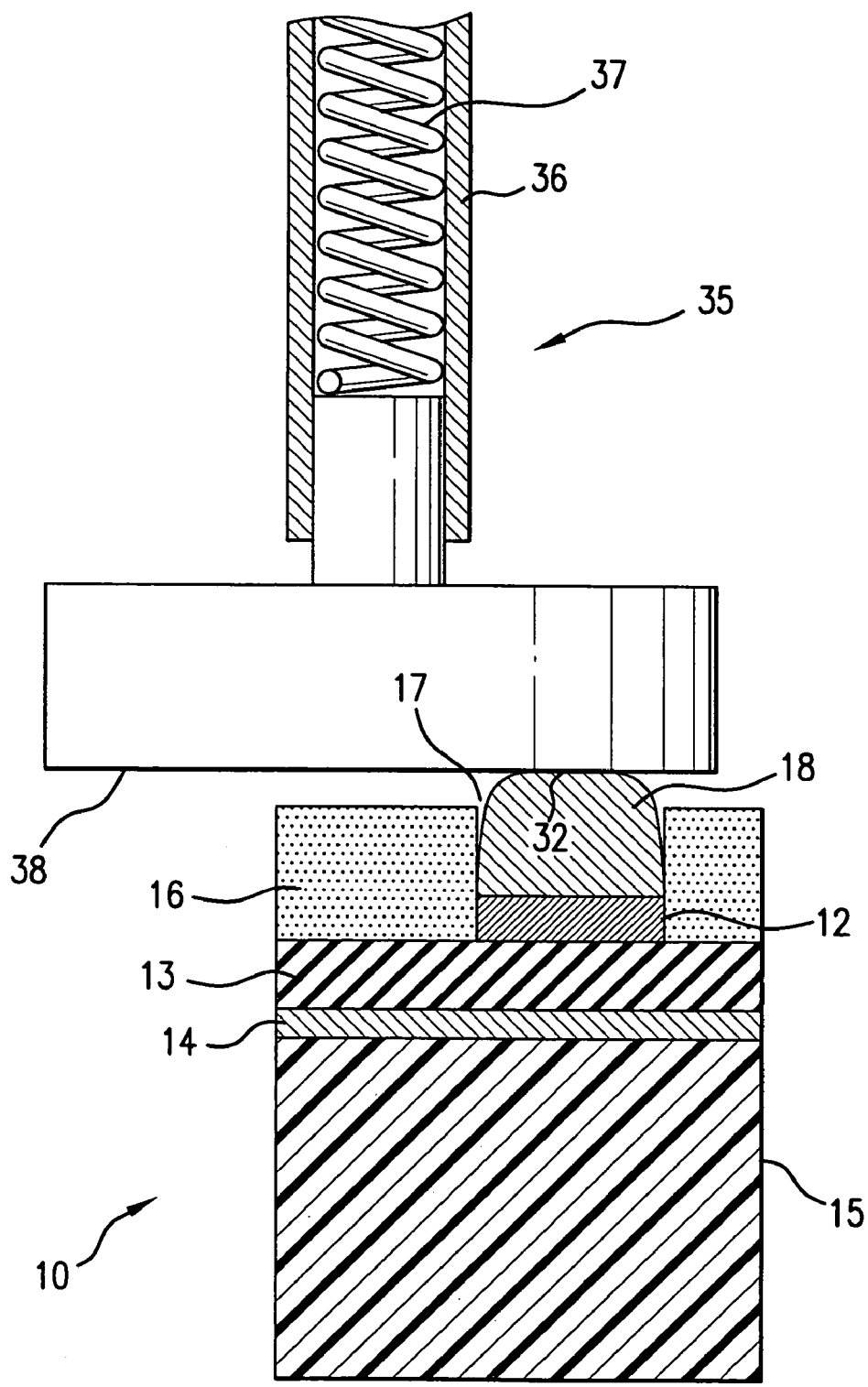
FIG. 3 is a cross-sectional side view showing a portion of a printed circuit board with a test access point structure on a trace and a fixture probe contacting the test access point structure.

As discussed more thoroughly in the above referenced patent applications, FIG. 3 illustrates one potential method to ensure electrical contact between the fixture probe and the test access point structure. FIG. 3 illustrates a side cross-sectional view of a fixture probe contacting a test point access structure in accordance with the invention. As shown in FIG. 3, a printed circuit board 10 comprises a substrate 15, a ground plane 14, and at least one dielectric layer 13 with at least one trace 12 printed, deposited or otherwise attached thereon. A solder mask 16 with a hole formed over the trace 12 at a location where a test access point structure 18 is positioned over the exposed surfaces of the dielectric layer 13 and trace layer 12. Test access point structure 18 is conductively attached to trace 12 within the solder mask hole 17 at the test access point. The test access point structure 18 projects above the exposed surrounding surfaces of the solder mask 16 to form an exposed localized high point on the trace 12 that may be electrically contacted as a test target by a fixture probe 35 during testing of the printed circuit board 10.

As discussed above and shown in FIG. 3, as the fixture probe 35 is brought into initial compressive contact with test access point structure 18, test access point structure will be deformed and form a substantially flat upper surface 32, which will move any potential surface oxide, residues or contaminates and permit a good electrical contact between the fixture probe 35 and the test access point structure 18. The compressive force between the fixture probe and the test access point structure 18 may be from any known means, such as a spring loaded fixture probe 35 with a shaft 36, a spring force mechanism 37 and a substantially flat contact area 38.

For the purposes of discussion, assume the fixture probe has a flat surface that comes in contact with the test access point or bead 18. If the radius of curvature is tight enough, the test access point structure 18 made of solder is subject to deformation when a fixture probe contacts it with a predetermined amount of force. A typical fixture probe force is approximately 4-8 ounces. The yield strength of typical solders (both leaded and lead-free) is approximately 5000 psi. Thus, when a fixture probe compressively contacts a newly formed bead or test access point 18 for the first time, the test access point 18 will deform with a substantially flattened top, as shown in FIG. 3. The flat area 32 grows as the solder deforms, until the flat area 32 is great enough to support the fixture probe force. The process of deforming the bead or test access point 18 displaces any surface oxides, contaminants or residues and gives the fixture probe excellent electrical contact to the solder of the test access point 18.

By way of analogy, one can think of a potato as a bead probe and the potato skin as surface contaminates, residues or oxides. The potato is placed on a flat, hard surface. A second object, representing a fixture probe, having a flat, hard surface with a diameter at least as large as that of the potato is brought into compressive contact with the potato until the surface of the potato begins to deform and flatten. As this happens, the potato skin will be deformed and the flat surface of the second object, representing the fixture probe will come into contact with the inside of the potato, representing uncontaminated solder of the bead probe.

As an exemplary model, the yield strength of solder is approximately 5000 psi or 0.005 pounds per square mil, or 0.08 ounces per square mil. Thus, to support a typical 4-ounce flat probe, the flattened area 32 of the test access point 18 must be 4/0.08 or 50 square mils. Assume a 5 mil wide by 20 mil long bead 18 that is approximately 3 mils high. Assume that when the fixture probe first touches the bead 18, there is no flattened surface area. Then as the fixture probe pushes down on the solder, the area that is flattened 32 approximates an ellipse with a 1:4 width/length ratio. As this area increases, the solder yield begins to flow until there is a "footprint" of 50 square mils, or about ½ the total area of the bead itself. Once the surface area is large enough to support the fixture probe force, no further deformation occurs. Subsequent probing does not produce any further deformation.

Once probing has flattened a bead probe, the solder bead is subject to growing a new very thin oxide layer of 1-2 nanometers or other surface contaminants as time passes. Therefore, if the board is returned from the field for re-test or if the board had to pass through a repair and re-test cycle, there may be a new oxide or contaminant layer on the surface of the bead probe 18. Since the flattened bead is already capable of supporting the probe force, no new deformation should occur to displace this oxide or contaminant layer. While lead-free solder (containing a majority of tin) may grow a conductive tin-oxide layer, older leaded solder may grow a lead-oxide layer that is a poor conductor. Thus, this oxide layer or other surface contaminants may adversely affect re-testing.

This problem may be addressed by using a smooth faced probe that rotates or twists about its long axis (around the z axis). FIG. 4A illustrates a twisting fixture probe 40 in contact with a bead probe or test access point structure 18 on a printed circuit board 10 in accordance with the invention. As the twist probe 40 is depressed inside its rifled barrel, an internal flange or other know mechanism causes it to rotate a predetermined number of degrees about the z-axis. This causes the twisting fixture probe 40 to rotate as it contacts the bead probe 18, which causes a wiping action that polishes the bead probe surface 32 clean of any oxide, residue or contaminant buildup. The twisting fixture probe 40 may have a relatively flat or smooth faced tip 44, because on a microscopic scale this is actually a rough surface that grinds the oxide, residue or contaminants off the bead probe surface 32, restoring adequate electrical contact between the bead probe 18 and the twisting fixture probe 40.

FIG. 4B illustrates a top view of bead probe 18 with probe tip 44 superimposed thereon, illustrating the rotating action as fixture probe 40 is brought into compressive contact with bead probe 18. FIG. 4B is shown with some misalignment between the bead probe 18 and the fixture probe tip 44, illustrating that for a bead probe 18 of approximately 3-5 mils by approximately 15-20 mils and a fixture probe tip 44 with a diameter of approximately 23-35 mil.

Figure 5:
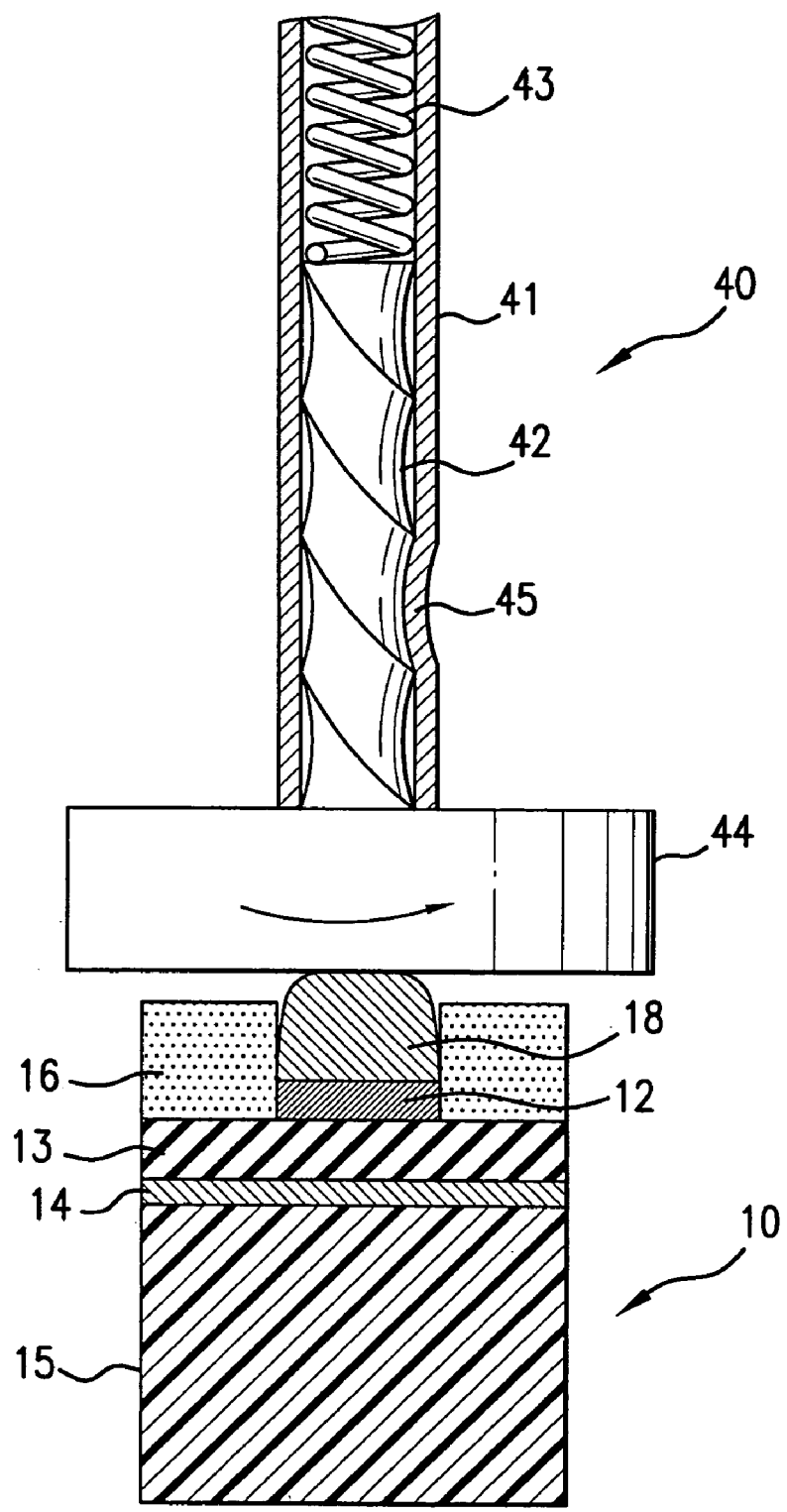
FIG. 5 is an side perspective view of a test access point structure with a twisting fixture probe.

FIG. 5 illustrates a twisting fixture probe 40, having a cylindrical member 41 housing a shaft 42 attached to a relatively flat tip 44. Shaft 42 causes tip 44 to rotate about the z-axis when brought into compressive contact with bead probe 18 by a force, such as spring force 43. Shaft 42 may be a relatively square shaft that has been twisted about its long axis, like a twisted licorice stick. As the twisted square shaft 42 is compressed by the spring force 43, it may come into contact with a flange or indentation 45 in the wall of the cylindrical member 41, causing the shaft 42 and the tip 44 to rotate. There are other anticipated means for causing tip 44 to rotate a predetermined amount as the tip 44 is brought into compressive contact with the bead probe 18, effectively cleaning the surface 32 of the bead probe 18. One potential limitation of a twisting probe as illustrated in FIG. 5 is that such a probe may be more difficult and expensive to manufacture that a typical fixture probe and may be subject to wearing out more readily than a typical fixture probe, which may significantly increase the cost of test, as several hundred fixture probes are used to test a typical printed circuit board.

Figure 6:
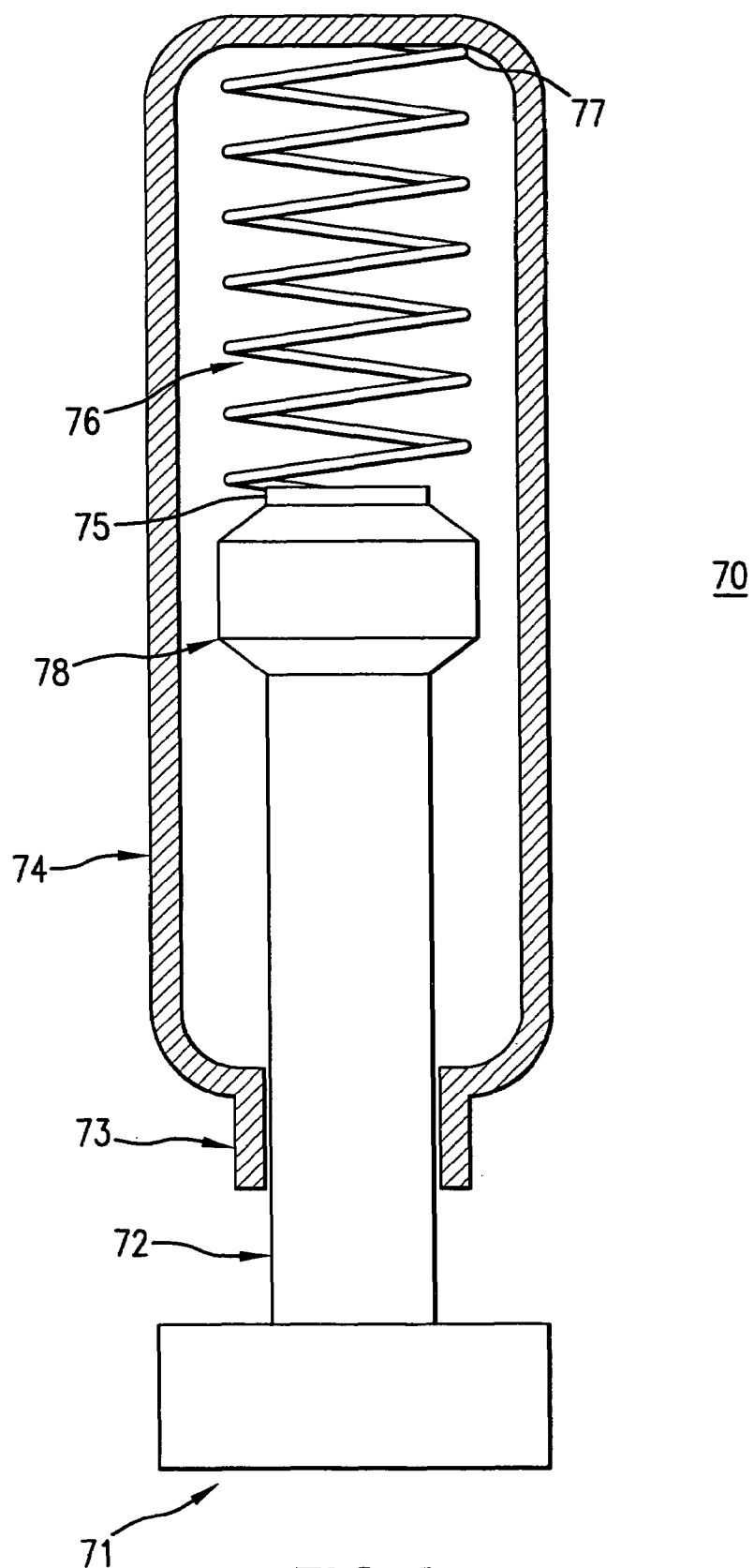
FIG. 6 is a cross-sectional side view of a twisting fixture probe according to a first embodiment of the invention.

FIG. 6 illustrates a twisting probe 70, having a barrel or cylindrical housing member 74 housing a plunger shaft 72 that is attached to a relatively flat probe face or tip 71. Barrel 74 may have a crimp 73 for retaining plunger shaft 72 by means of a retaining bulge 78. A compressive force means, such as a spring 76 may bring the probe face 71 into compressive contact with a bead probe 18. To cause the probe face 71 to rotate as the probe face 71 is brought into compressive contact with the bead probe, the top end of the spring 76 may be attached to the top of the barrel 74 at 77 and the bottom of spring 76 may be attached to the end of the retaining bulge 78 at 75. The attachment of the spring to the barrel 74 and the retaining bulge 78 may be by any known means, such as glue, solder, adhesive, or the like. When both ends of spring 76 are mechanically fixed or attached, the top of the spring cannot rotate with respect to the barrel 74 and the bottom of the spring cannot rotate independent of the plunger shaft 72. Therefore, as the spring compresses when the fixture probe 70 is brought into compressive contact with a bead probe 18, the probe face 71 will rotate with the rotation of the plunger shaft 72, caused by the spring rotating during compression.

By fixing the two ends of the spring 76, any torsional movement naturally generated in the spring as it is compressed will be transmitted to the plunger shaft 72. This will cause it to rotate with respect to the probe barrel 74 as the spring is compressed. Also, as the spring is compressed, the force needed to further compress the spring rises. Thus, any bead 18 contacted by the flat probe face 71 will see a continuous rise in applied force, as well as a tendency for the probe face 71 to rotate while the spring 76 is being compressed. The amount of rotation will be governed by the length of the spring 76 and the number of turns in it. The target rotations of 10-30 degrees may be specifically engineered. Thus, a soldered-spring probe assembly could be used to generate a twist probe. However, one limitation of this twisting probe is that the soldering process is labor intensive and can introduce harmfully corrosive flux residue products inside the barrel 74 as the solder is reflowed, which can make such probes expensive and potentially unreliable.

Figures 7, 8:
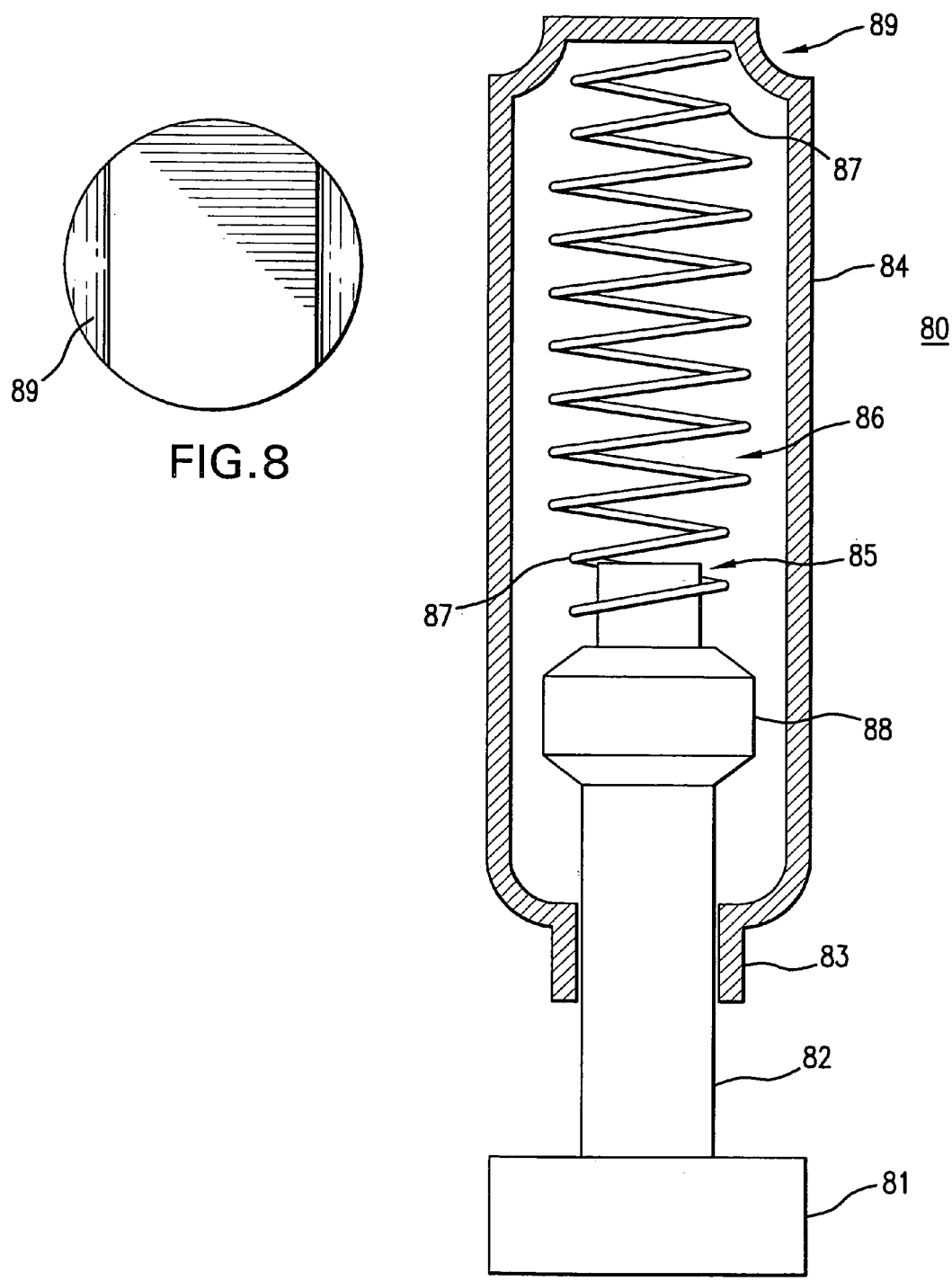
FIG. 7 is a cross-sectional side view of a twisting fixture probe according to a second embodiment of the invention.
FIG. 8 is an end view of the twisting fixture probe of FIG. 7.
Figure 10:
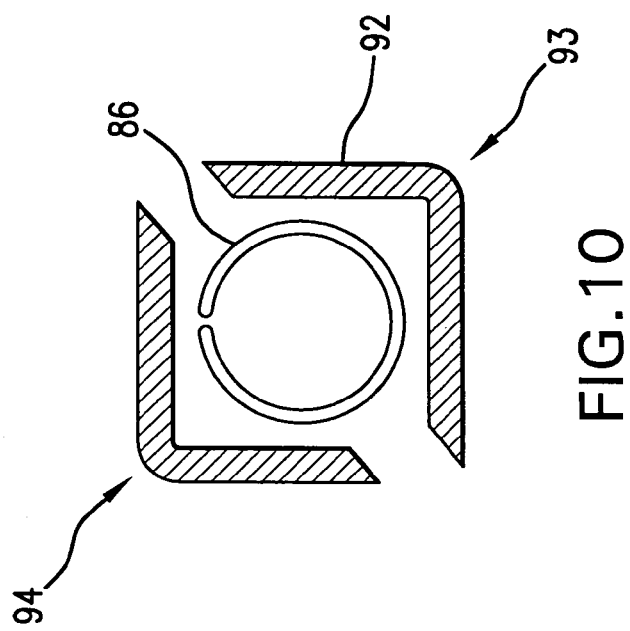
FIG. 10 shows an exemplary spring crimping tool.
Figure 9B:
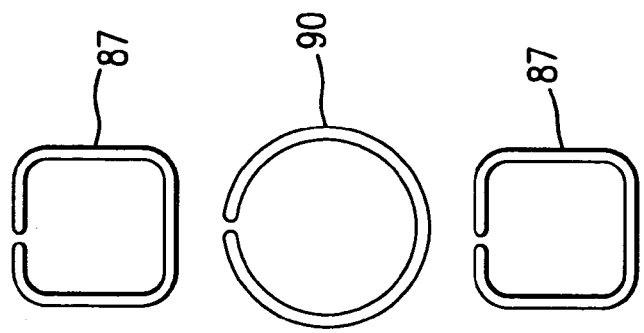
FIG. 9 shows a side view of a spring mechanism of FIG. 7 with spring cross sections as different sections of the spring mechanism.
Figure 9A:
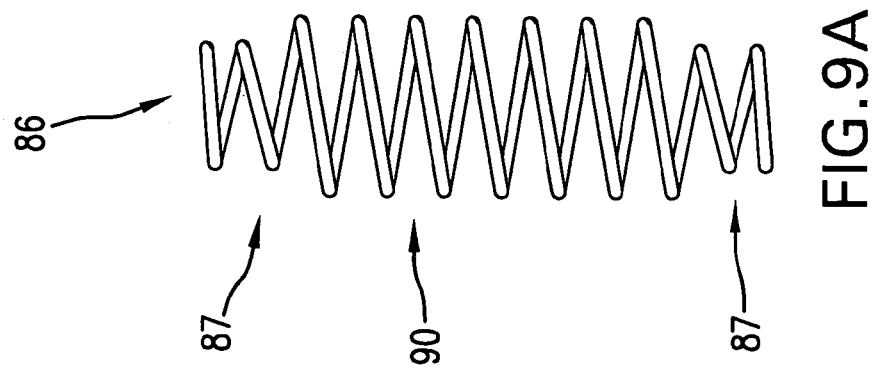

FIG. 7 illustrates a twisting fixture probe 80, having a barrel or substantially cylindrical housing member 84 housing a plunger shaft 82 that is attached to a substantially flat probe face or tip 81. Barrel 84 may have a crimp 83 for retaining plunger shaft 82 by means of a retaining bulge 88. Retaining bulge 88 may have a squared end 85 (also shown in FIGS. 11 and 12) that may be squared by any convenient process, such as milling or hammering. A compressive force, such as a spring 86 may be squared symmetrically at both ends 87 by any convenient process, such as a crimping process. Although symmetry is not required, symmetry means that there would be no orientation issue with respect to the spring 86 and either end could be inserted into the barrel 84. The squared ends 87 and circular center 90 of spring 86 are shown in FIG. 9a in a side view and in FIG. 9b in cross-sectional views. FIG. 10 illustrates a potential spring crimping tool 92 with forces 93 and 94 used to crimp a normally circular wound spring 86. The squared end 85 of retainer bulge 88 is engineered to fit inside the squared coil end 87 of the spring 86 (as shown in FIGS. 7 and 12). This will prevent the probe shaft from rotating with respect to the end of the spring. The barrel 84 is modified to clasp or retain the other squared end 87 of the spring 86 to prevent rotation of the spring 86 relative to the barrel 84. Barrel 84 may be modified by crimping the end at 89 as shown in FIGS. 7 and 8. This will create a squared end 89 that will prevent the squared end 87 of the spring 86 from rotating relative to the barrel 84.

By fixing the two ends 87 of the spring 86, any torsional movement naturally generated in the spring as it is compressed will be transmitted to the plunger shaft 82, which will cause it to rotate with respect to the probe barrel 84 as the spring 86 is compressed. Also, as the spring 86 is compressed, the force needed to further compress the spring rises. Thus, any bead 18 contacted by the flat probe face 81 will see a continuous rise in applied force, as well as a tendency for the probe face 81 to rotate while the spring 86 is being compressed. This will cause the flat probe face 81 to twist and wipe the surface of the bead 18, thus effectively cleaning the surface of the bead 18 of any potential contaminants. The amount of rotation of the flat probe face 81 may be governed by the length of spring 86 and the number of turns in it. The target rotations of 10-30 degrees may be specifically engineered.

Other variations would be to use a non-round spring with some other number of corners, such as a triangular or hexagon spring spindle. The base of the barrel 84 can be chamfered, crimped or beveled also. The spring's entire length could have these corners rather than just the ends, by replacing the normally circular winding process with a non-round spindling process. Matching crimps in the barrel end 89 and on the end 85 of the retainer bulge 88 would assure the spring 86 does not rotate independently of the barrel 84 and shaft 82, thus, transferring any rotation of the spring 86 into the shaft 82 during compression of the spring 86.

Figure 13:
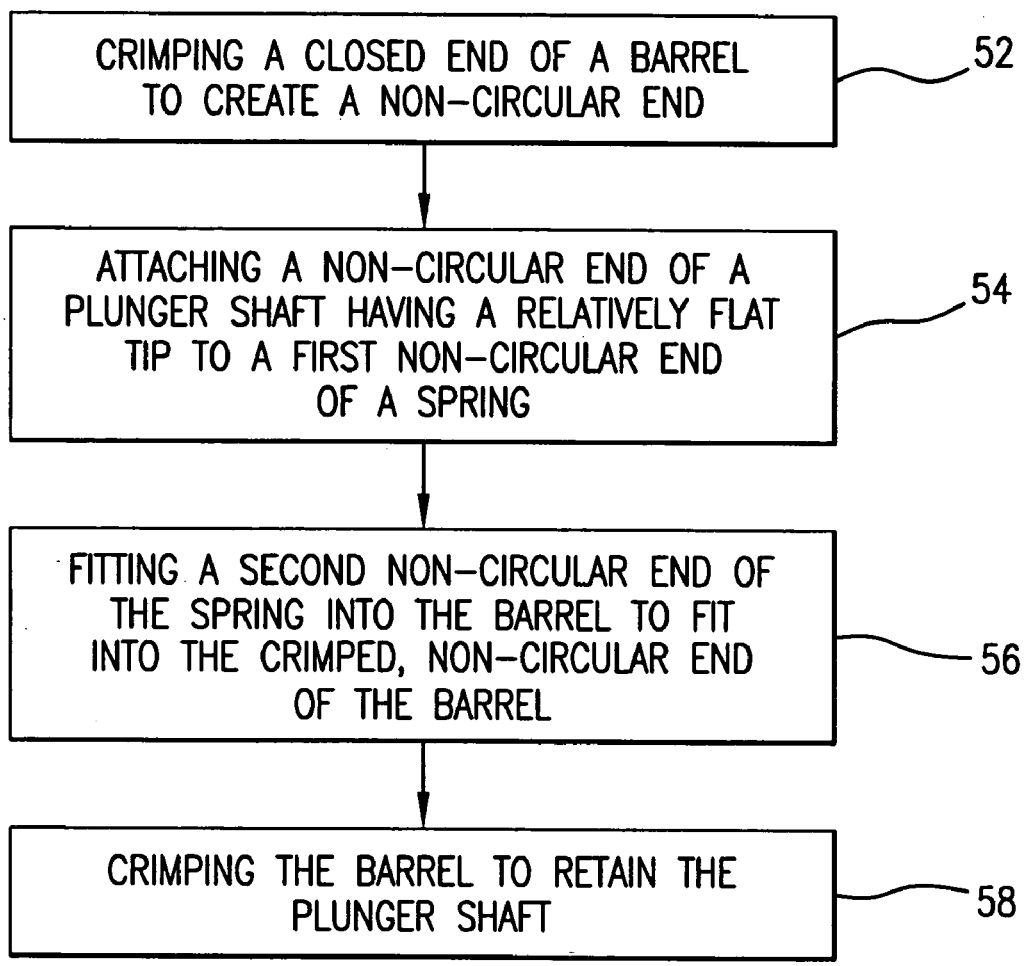
FIG. 13 is an operational flow chart illustrating a method for implementing a twisting fixture probe in accordance with the invention.

FIG. 13 is an operational flow chart 50 for a method of implementing a twisting fixture probe according to FIGS. 7-12, in which a closed end of a barrel 84 is crimped 52 to create a non-circular end. A non-circular end 85 of a plunger shaft 82 having a relatively flat tip 81 is attached 54 to a first non-circular end 87 of a spring 86. A second non-circular end 87 of the spring 86 is fitted 56 into the barrel 84 to fit into the non-circular end 89 of the barrel 89. The open end of the barrel 83 is crimped 58 to retain the plunger shaft 82.

Figure 14:
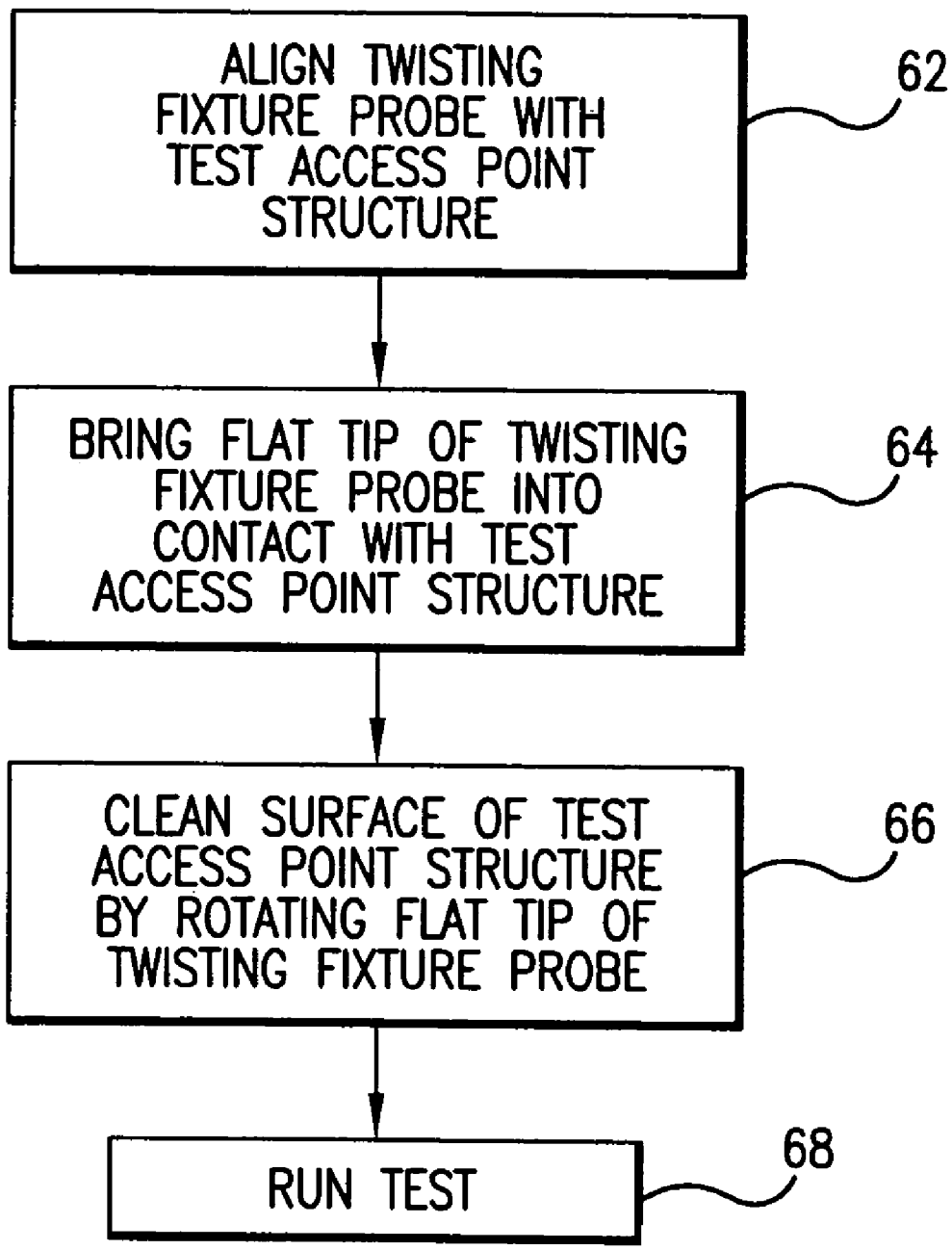
FIG. 14 is an operational flow chart illustrating a method of testing a test access point structure on a trace of a printed circuit board with a twisting fixture probe in accordance with the invention.

FIG. 14 is an operational flow chart for a method 60 of probing a bead probe 18 with a twisting fixture probe 80 in accordance with FIGS. 7-14. In operation, a twisting fixture probe 80 in a test fixture (not shown) is aligned with a test access point structure 18 on a trace 12 of a printed circuit board 10 at step 62. A substantially flat tip 81 of twisting fixture probe 80 is brought into contact with a top surface of a test access point structure 18 at step 64. Electrical contact is ensured as the top surface 32 of test access point structure 18 is cleaned of any oxides, residues or contaminants as the substantially flat tip 81 is rotated by applying a compressive force through a spring 86 to a plunger shaft 82 attached to the substantially flat tip 81 at step 66. After electrical contact is ensured, tests may be run requiring electrical contact between the test access point structure 18 and the fixture probe 80.

It will be appreciated from the above detailed description of the invention that the invention uniquely permits cleaning of a bead probe 18 through a rotational wiping of a bead probe 18 when a fixture probe 80 is brought into compressive contact therewith. Also, as shown in FIGS. 7-14, this may be accomplished in a manner that is economically feasible and without creating harmful or potentially corrosive flux residue problems for the fixture probe. Although the preferred embodiment of the invention has been disclosed for illustrative purposes, those skilled in the art will appreciate that various modifications, additions and substitutions are possible, without departing from the scope and spirit of the invention as disclosed in the accompanying claims. For example, the tip of the twisting fixture probe may be a shape other than circular. The spring may be crimped or wound in a non-circular spindle in order to have corners rather than a circular spiral shape. The spring ends, retainer end and barrel end may be any non-circular shape that permits retaining the spring 86 from rotating relative to the plunger shaft 82 and the barrel 84.

What is claimed is:

1. A method for probing a bead probe on a printed circuit board, the method comprising:

aligning a twisting fixture probe with a bead probe conductively attached to a trace on a printed circuit board, the bead probe comprising a localized high point of solder along the trace of the printed circuit board for enabling contact with a probe tip wider than the bead probe without damaging printed circuit board components near the bead probe, the bead probe being the same width as the trace for enabling bead probe placement without modifying printed circuit board lay-out, wherein the twisting fixture probe has a spring with a first end that is mechanically held within a test fixture probe barrel against rotational movement relative to the test fixture probe barrel and a second end that is mechanically attached to a first end of a plunger shaft against rotational movement relative to the plunger shaft; and bringing a tip at a second end of the plunger shaft into compressive contact with the bead probe, wherein the tip rotates as the spring is compressed and wipes the surface of the bead probe, cleaning any contaminants thereon.

2. The method of claim 1, further comprising the step of running one or more tests with the twisting fixture probe in compressive contact with the bead probe.

3. The method of claim 1, wherein the tip at the second end of the plunger shaft of the twisting fixture probe is flat.

4. The method of claim 3, wherein the tip at the second end of the plunger shaft of the twisting fixture probe is flat and larger than the bead probe.

5. The method of claim 4, wherein the diameter of the circular tip at the second end of the plunger shaft of the twisting fixture probe is approximately 23-35 mil in diameter.

6. The method of claim 1, wherein the tip at the second end of the plunger shaft of the twisting fixture probe is circular.

7. A method for probing a test access point structure on a printed circuit board, the method comprising:

aligning a contact tip of a fixture probe with a test access point structure on a printed circuit board, the test access point structure comprising a localized high point of solder along a trace of the printed circuit board for enabling contact with a probe tip that is wider than the test access point structure without physically contacting printed circuit board components in the vicinity of the test access point structure, the test access point structure being conductively attached to the trace along an upper surface of the trace, the test access point structure being the same width as the trace for enabling test access point structure placement without impacting printed circuit board lay-out;

bringing the contact tip of the fixture probe into compressive contact with a surface of the test access point structure; and rotating the contact tip of the fixture probe, thereby wiping the surface of the test access structure with the contact tip of the fixture probe.

8. The method of claim 7, wherein the contact tip of the fixture probe is larger than the test access structure.

9. The method of claim 7, wherein the fixture probe is a twisting fixture probe.

10. The method of claim 9, wherein the wiping of the upper surface of the test access structure is accomplished by the twisting motion of the twisting fixture probe.

11. The method of claim 10, further comprising the step of running one or more test with the twisting fixture probe in compressive contact with the test access structure.

12. The method of claim 7, wherein the contact tip of the fixture probe is flat.

13. The method of claim 12, wherein the contact tip of the flat fixture probe is circular.

14. The method of claim 13, wherein the diameter of the circular contact tip of the fixture probe is approximately 23-35 mil in diameter.

* * * * *